United States Patent
Kishi

(10) Patent No.: US 9,964,584 B2
(45) Date of Patent: May 8, 2018

(54) METHOD FOR MANUFACTURING DISPLAY DEVICE

(71) Applicant: JOLED INC., Tokyo (JP)

(72) Inventor: Yuki Kishi, Tokyo (JP)

(73) Assignee: JOLED INC., Tokyo (JP)

( * ) Notice: Subject to any disclaimer, the term of this patent is extended or adjusted under 35 U.S.C. 154(b) by 12 days.

(21) Appl. No.: 15/119,419

(22) PCT Filed: Dec. 24, 2014

(86) PCT No.: PCT/JP2014/006436
§ 371 (c)(1),
(2) Date: Aug. 17, 2016

(87) PCT Pub. No.: WO2015/128921
PCT Pub. Date: Sep. 3, 2015

(65) Prior Publication Data
US 2017/0067956 A1    Mar. 9, 2017

(30) Foreign Application Priority Data

Feb. 25, 2014   (JP) .................................. 2014-033752

(51) Int. Cl.
*G01R 31/26*    (2014.01)
*G01R 31/02*    (2006.01)
(Continued)

(52) U.S. Cl.
CPC ......... *G01R 31/2621* (2013.01); *G01R 31/27* (2013.01); *G01R 31/44* (2013.01);
(Continued)

(58) Field of Classification Search
CPC ........ G01R 21/133; G01R 27/14; G06F 13/20
(Continued)

(56) References Cited

U.S. PATENT DOCUMENTS 6,617,972 B2 * 9/2003 Takarada ........... G08B 21/0484
324/538
8,228,271 B2   7/2012 Hirai et al.
(Continued)

FOREIGN PATENT DOCUMENTS

JP    2006-195030    7/2006
JP    2007-85782     4/2007
(Continued)

OTHER PUBLICATIONS

International Search Report (ISR) in International Pat. Appl. No. PCT/JP2014/006436, dated Mar. 31, 2015.

*Primary Examiner* — Giovanni Astacio-Oquendo
(74) *Attorney, Agent, or Firm* — Greenblum & Bernstein, P.L.C.

(57) ABSTRACT

A method for manufacturing a display device including a light-emitting pixel and a drive transistor that drives the light-emitting pixel using current, includes: (a) placing the display device in a light-emitting state; (b) placing the display device in a no-light-emitting state after (a); (c) leaving the display device in the non-light-emitting state for a predetermined period; (d) placing the display device in the light-emitting state again after (c); and (e) start measuring luminance of the display device at a start of (d).

4 Claims, 8 Drawing Sheets

(51) Int. Cl.
*G09G 3/00* (2006.01)
*G09G 3/20* (2006.01)
*G09G 3/30* (2006.01)
*G01R 31/27* (2006.01)
*G01R 31/44* (2006.01)
*G09G 3/3291* (2016.01)

(52) U.S. Cl.
CPC .............. *G09G 3/006* (2013.01); *G09G 3/20* (2013.01); *G09G 3/30* (2013.01); *G09G 3/3291* (2013.01); *G09G 2300/0819* (2013.01); *G09G 2320/0233* (2013.01); *G09G 2320/045* (2013.01); *G09G 2320/0626* (2013.01)

(58) Field of Classification Search
USPC ............ 324/76.11, 76.61, 76.69, 76.74, 103, 324/762.09
See application file for complete search history.

(56) References Cited

U.S. PATENT DOCUMENTS

| | | | |
|---|---|---|---|
| 8,779,729 B2* | 7/2014 | Shiraishi | G01R 31/3606 320/134 |
| 2007/0063727 A1 | 3/2007 | Miyake | |
| 2010/0073265 A1 | 3/2010 | Hirai et al. | |
| 2012/0098518 A1* | 4/2012 | Unagami | G01R 22/066 324/74 |
| 2017/0069696 A1* | 3/2017 | Kondo | H01L 27/3246 |
| 2017/0077190 A1* | 3/2017 | Hashimoto | G09F 9/30 |
| 2017/0098398 A1* | 4/2017 | Amatsuchi | G01M 11/0264 |

FOREIGN PATENT DOCUMENTS

| | | |
|---|---|---|
| JP | 2009-104104 | 5/2009 |
| JP | 2011-013123 | 1/2011 |
| JP | 2011-221202 | 11/2011 |
| JP | 2013-222057 | 10/2013 |

* cited by examiner

METHOD FOR MANUFACTURING DISPLAY DEVICE

TECHNICAL FIELD

The present disclosure relates to a display device including a drive transistor for causing a light-emitting element to emit light.

BACKGROUND ART

In recent years, organic EL (electroluminescent) displays which make use of organic EL (electroluminescence) have been the focus of attention as one of next-generation flat panel displays to replace liquid-crystal displays. In active-matrix display devices such as organic EL displays, thin-film transistors (TFTs) are used as drive transistors.

CITATION LIST

Patent Literature

[PTL 1] Japanese Unexamined Patent Application Publication No. 2009-104104

SUMMARY OF INVENTION

Technical Problem

In the manufacturing stage of a display device including a drive transistor, such as an organic EL display, there are cases where lifespan characteristics, for example, are measured. Specifically, the change over time of luminance is measured.

Conventionally, however, there is the problem that the data obtained in the luminance measurement is greatly affected by the light-emitting state immediately before the luminance is measured and the timing at which the luminance is measured.

The present disclosure is conceived in view of the aforementioned problem and has as an object to provide a method for manufacturing a display device which is not affected by the light-emitting state up to immediately before luminance is measured and the timing at which luminance is measured during luminance measurement, and thus improves luminance measurement reliability.

Solution to Problem

In order to realize the aforementioned object, a method for manufacturing a display device which includes a light-emitting pixel and a drive transistor that drives the light-emitting pixel using current of the present disclosure includes: (a) placing the display device in a light-emitting state; (b) placing the display device in a non-light-emitting state after (a); (c) leaving the display device in the non-light-emitting state for a predetermined period; (d) placing the display device in the light-emitting state again after (c); and (e) measuring luminance of the display device at a start of (d).

Advantageous Effects of Invention

According to the present disclosure, it is possible to avoid the effects of the light-emitting state immediately before luminance is measured and the timing at which luminance is measured during luminance measurement, and thus it is possible to improve luminance measurement reliability for a method for manufacturing a display device which includes a drive transistor.

DESCRIPTION OF EMBODIMENT

Hereinafter, an embodiment will be described in detail with reference to the drawings. However, there are instances where overly detailed description is omitted. For example, detailed description of well known matter, redundant description of substantially identical structural components, etc. may be omitted. This is to prevent the subsequent description from becoming unnecessarily redundant, and thus facilitate understanding by a person having ordinary skill in the art.

It should be noted that the enclosed drawings and subsequent description are provided by the inventor so that the person having ordinary skill in the art is able to sufficiently understand the present disclosure, and are not intended to limit the scope of the subject matter recited in the claims.

Hereinafter, a method for manufacturing a display device including a drive transistor, according to an embodiment in the present disclosure will be described using the drawings and an EL display device as an example.

[1. Outline of Display Device]

Figure 1:
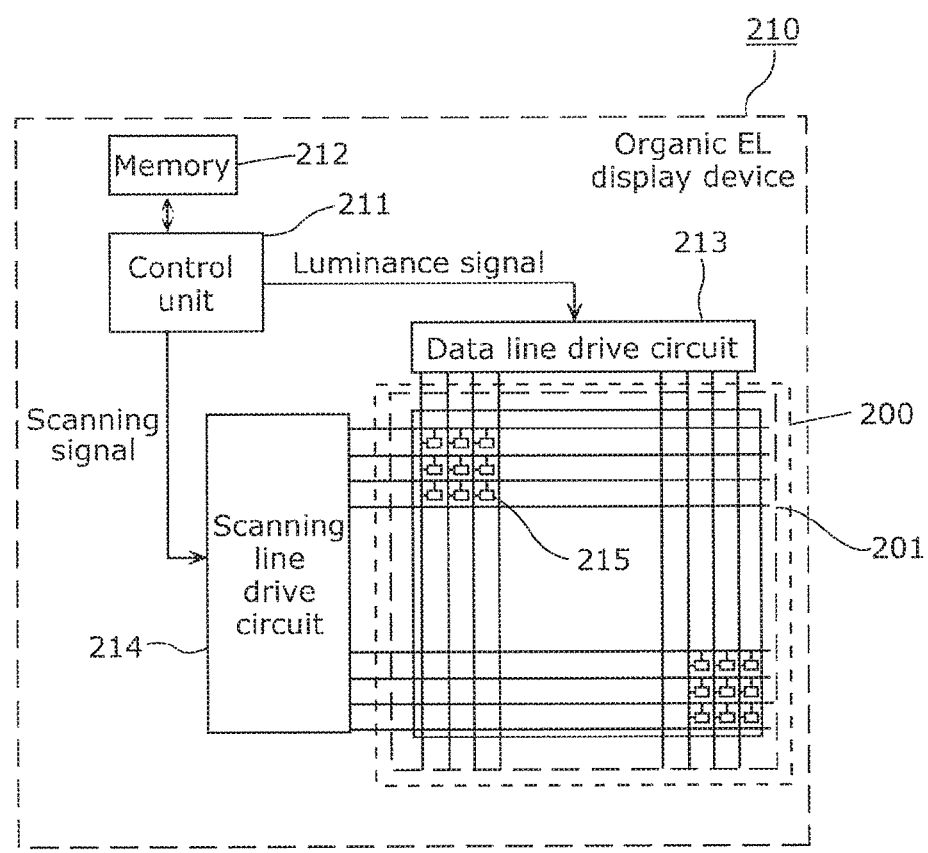
FIG. 1 is a block diagram illustrating the functional configuration of an organic EL display device including an organic EL display panel, which is an example of a display device including a drive transistor.

FIG. 1 is a block diagram illustrating the functional configuration of an organic EL display device including an organic EL display panel, which is an example of a display device including a drive transistor.

As illustrated in the figure, an organic EL display device 210 includes an organic EL display panel 200, a data line drive circuit 213, a data line drive circuit 214, a control unit 211, and a memory 212.

The organic EL display panel 200 is a device to which the data line drive circuit 213 and the data line drive circuit 214 are connected as driver devices, and which can be caused to display text and images (including video) by controlling the amount of light emitted by each of minute light-emitting pixels 215 which are arranged in a matrix, based on signals (luminance signal, scanning signal) inputted from the driver devices.

The control unit 211 controls the data line drive circuit 213, the data line drive circuit 214, and the memory 212, and specifically controls the output timing of signal voltages which are to be outputted from the data line drive circuit 213 and the output timing of scanning signals which are to be outputted from the data line drive circuit 214.

Furthermore, control unit 211 performs processing to convert a video signal inputted from the outside into signal voltage that determines the light emission of the light-emitting pixels, reads correction data written into the memory 212, corrects the signal voltage that is based on the video signal inputted from the outside, based on the correction data, and outputs the corrected signal voltage to the data line drive circuit 213 in scanning order.

The characteristics and correction data, such as accumulated stress, etc., of the drive transistor (described later) of each of the light-emitting pixels 215 are stored in the memory 212.

The data line drive circuit 213 is a circuit device that outputs signal voltage to respective data lines to realize light emission by the light-emitting pixels which corresponds to a video signal, and is one of what is called a driver device.

The scanning line drive circuit 214 is a circuit device that outputs a scanning signal to respective scanning lines to thereby drive a circuit element included in each of the light-emitting pixels a predetermined drive timing.

A display region 201 of the organic EL display panel 200 is a region in which the light-emitting pixels 215 are arranged in a matrix, and each of the light-emitting pixels 215 emits light according to the luminance signal from the data line drive circuit 213 and the scanning signal from the scanning line drive circuit 214.

Figure 2:
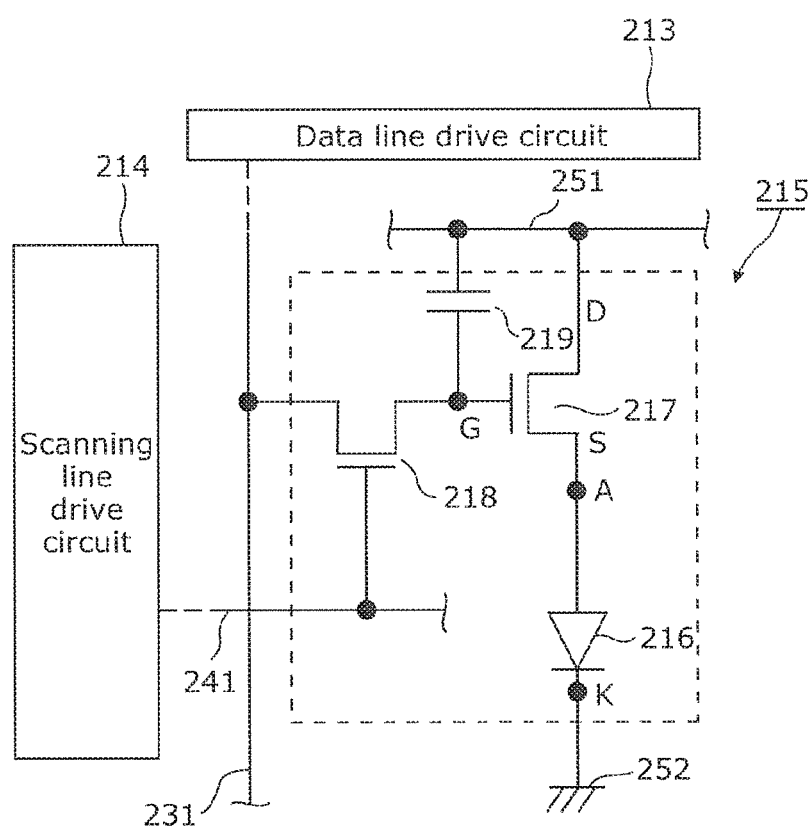
FIG. 2 is a diagram illustrating an example of a circuit configuration diagram of a light-emitting pixel including an organic EL element.

FIG. 2 is a diagram illustrating an example of a circuit configuration diagram of a light-emitting pixel including an organic EL element.

The light-emitting pixel 215 illustrated in the figure includes an organic EL element 216, a drive transistor 217, a selection transistor 218, and a capacitor 219. A data line 231 is disposed to each column of the light-emitting pixels 215 which are arranged in a matrix, and a scanning line 241 is disposed to each row of the light-emitting pixels 215. Furthermore, a positive power supply line 251 and a negative power supply line 252 are disposed in common to all of the light-emitting pixels 215. The drain electrode of the selection transistor 218 is connected to the data line 231 and the gate electrode of the selection transistor 218 is connected to the scanning line 241. In addition, the source electrode of the selection transistor 218 is connected to the capacitor 219 and the gate electrode of drive transistor 217. Furthermore, the drain electrode of the drive transistor 217 is connected to the positive power supply 251, and the source electrode of the drive transistor 217 is connected to the organic EL element 216.

Figure 3:
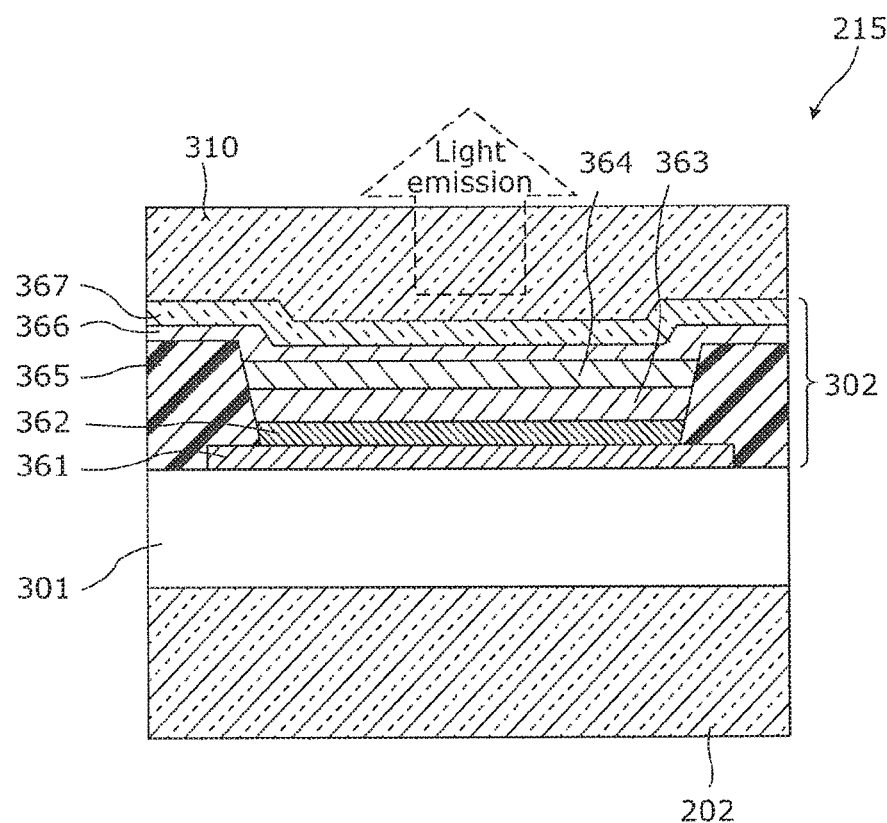
FIG. 3 is a cross-sectional view schematically illustrating an example of the structure of a light-emitting pixel.

FIG. 3 is a cross-sectional view schematically illustrating an example of the structure of a light-emitting pixel.

The light-emitting pixel 215 in the figure includes a substrate 202, a drive circuit layer 301, a light-emitting layer 302, and a transparent sealing film 310.

The substrate 202 is board-shaped component on which a plurality of light-emitting pixels 251 are arranged in rows and columns, and is, for example, a glass substrate. It should be noted that a flexible substrate made of resin can also be used for the substrate 202. Together with drive circuit layer 301, a thin-film transistor (TFT) is also formed on the surface of the substrate 202. It should be noted that, in the case of the top emission structure illustrated in FIG. 3, the substrate 202 does not need to be transparent, and thus a non-transparent substrate, for example, a silicon substrate, can also be used.

The drive circuit layer 301 includes a drive transistor (217 in FIG. 2), a capacitor (219 in FIG. 2), and a selection transistor (218 in FIG. 2) which are formed on the substrate 202. The flatness of the top face of the drive circuit layer 301 is ensured by using a planarizing film.

The light-emitting layer 302 is a layer that makes up the organic EL element 216, and includes an anode 361, a hole injection layer 362, a hole transport layer 363, an organic light-emitting layer 364, a bank layer 365, an electron injection layer 366, and a transparent cathode 367.

The light-emitting pixel 215 illustrated in FIG. 3 has a top emission structure, and, when voltage is applied to the light-emitting layer 302, light is generated in the organic light-emitting layer 364, and the light is emitted upward through the transparent cathode 367 and the transparent sealing film 310. Furthermore, of the light generated in the organic light-emitting layer 364, the light heading downward is reflected by the anode 361 and is emitted upward through the transparent cathode 367 and the transparent sealing film 310.

Anode 361 is an electrode which is stacked on the surface of the planarizing film of the drive circuit film 301, and, with reference to the transparent cathode 367, applies positive voltage to the light-emitting layer 302. For the anode material making up the anode 361, it is preferable to use, for example, Al or Ag, which are highly reflective metals, or an alloy thereof. Furthermore, the thickness of the anode 361 is, for example, 100 nm to 300 nm.

Hole injection layer 362 is formed on the surface of the anode 361, and has a function of stably injecting holes, or supplementing hole generation and injecting the holes, into the organic light-emitting layer 364. This lowers the drive voltage of the light-emitting layer 302, and the stabilization of hole injection prolongs the lifespan of the element. For the material of the hole injection layer 362, polyethylenedioxythiophene (PEDOT), for example, can be used. Furthermore, it is preferable that the thickness of the hole injection layer 362 be, for example, approximately 10 nm to 100 nm.

The hole transport layer 353 is formed on the surface of the hole injection layer 362, and has the functions of efficiently transporting the holes injected from the hole injection layer 362 to the inside of the organic light-emitting layer 364, preventing exciton deactivation at the interface of the organic light-emitting layer 364 and the hole injection layer 362, and, in addition, blocking electrons. For the material of the hole transport layer 363, a high molecular organic material having a characteristic of transmitting generated holes by inter-molecular charge transfer reaction, such as triphenylamine, polyaniline, etc. can be considered. Furthermore, the thickness of the hole transport layer 363 is, for example, approximately 5 nm to 50 nm.

It should be noted that there are instances where the hole transport layer 363 is omitted depending on the materials of the hole injection layer 362 and the organic light-emitting layer 364 which are layers adjacent to the hole transport layer 363.

The organic light-emitting layer 364 is formed on the surface of the hole transport layer 363, and has a function of emitting light as a result of being placed in an excited state generated by the injection and recombination of holes and electrons. For the material of the organic light-emitting layer 364, aside from a low molecular organic material, a high molecular organic material having a light-emitting property which can be formed by a wet film forming method such as inkjet printing and spin-coating can also be used. The organic light-emitting layer 364 formed from a high molecular organic material is characterized by a simple structure, good film reliability, and low-voltage drivability. A polymer having a conjugated system, such as an aromatic ring or a fused ring, or a pi-conjugated system polymer is fluorescent, and thus can be used as the high molecular organic material which makes up the organic light-emitting layer 364. Polyphenylene vinylene (PPV) or a derivative thereof (a PPV derivative), polyfluorene (PFO) or a derivative thereof (a PFO derivative), a polyspirofluorene derivative, etc., can be considered for the high molecular light-emitting material making up the organic light-emitting layer 364. Furthermore, polythiophene or a derivative thereof can also be used.

The bank layer 365 is formed on the surface of the drive circuit layer or anode 361, and functions as a bank which forms, into predetermined regions, the hole transport layer 363 and the organic light-emitting layer 364 which are formed using a wet film forming method. Although the material used for the bank layer 365 may either be an inorganic substance or an organic substance, an organic substance generally has higher water repellency and is thus more preferable to use. A resin such as a polyimide, polyacryl, etc, can be given as an example of such a material. The thickness of the bank layer 365 is, for example, approximately 100 nm to 3000 nm.

The electron injection layer 366 is formed on the organic light-emitting layer 364, and has a function of reducing the obstruction of electron injection to the organic light-emitting layer 364, lowering the drive voltage of the light-emitting layer 302, and suppressing exciton deactivation. With this, it is possible to stabilize electron injection and prolong element lifespan, and strengthen the adherence with the transparent cathode 367 to improve light-emitting face uniformity and reduce element defects. Although the material of the electron injection layer 366 is not particularly limited, it is preferably made of barium, aluminum, phthalocyanine, lithium fluoride, or, additionally, a barium-aluminum laminated body, etc. The thickness of the electron injection layer 366 is, for example, approximately 2 nm to 50 nm.

The transparent cathode 367 is stacked on the surface of the electron injection layer 366, and has a function of applying negative voltage to the light-emitting layer 302 in contrast to the anode 361, and injecting electrons to the inside of the element (particularly the organic light-emitting layer 364). Although the material of the transparent cathode 367 is not particularly limited, it is preferable to use a substance and structure having high light-transmissivity.

With this, a top emission organic EL element having high light-emission efficiency can be realized. Although the material of the transparent cathode 367 is not particularly limited, a metal oxide layer is used. Although the material of the metal oxide layer is not particularly limited, a layer made from an indium tin oxide (hereafter denoted as ITO) or an indium zinc oxide (hereafter denoted as IZO) is used. Furthermore, the thickness of the transparent cathode 367 is, for example, approximately 5 nm to 200 nm.

The transparent sealing film 310 is formed on the surface of the transparent cathode 367, and has a function of protecting the element from moisture. Furthermore, the transparent sealing film 310 is required to be transparent. The transparent sealing film 310 is made from, for example, SiN, SiON, or an organic film. Furthermore, the thickness of the transparent sealing film 310 is, for example, approximately 20 nm to 5000 nm.

According to the structure of the light-emitting pixel 215 described above, the organic EL display device 210 functions as an active-matrix display device.

In the above-described configuration, when a scanning signal is inputted to the scanning line 241 and the selection transistor 218 is turned ON, a voltage corresponding to the signal voltage supplied via the data line 231 is written into the capacitor 219. Then, a held voltage corresponding to the signal voltage written into the capacitor 219 is held over one frame period, and the held voltage causes an analog change in the conductance of the drive transistor 217, and a drive current corresponding to the light-emission gradation is supplied to the anode of the light-emitting EL element 216. In addition, the drive current supplied to the anode of the light-emitting EL element 216 flows to the cathode of the light-emitting EL element 216. With this, light-emitting EL element 216 emits light which is displayed as an image. At this time, a forward bias voltage corresponding to the signal voltage is applied to the anode of the light-emitting EL element 216.

It should be noted that the circuit configuration of the light-emitting pixel described above is not limited to the circuit configuration illustrated in FIG. 3. Although the selection transistor 218 and the drive transistor 217 are circuit components needed for passing, to the organic EL element 216, a drive current that is in accordance with a signal voltage, the circuit configuration is not limited to the above-described form. Furthermore, even when another circuit component is added to the above-described circuit components, such configuration is also included in the light-emitting pixel circuit of the organic EL display device according to the present disclosure.

[2. Underlying Knowledge Forming the Basis of the Present Disclosure]

The underlying knowledge forming the basis of the present disclosure is described below.

The threshold voltage of a drive transistor included in a light-emitting pixel of the organic EL display device will be described. In the drive transistor configured of a TFT, the threshold voltage changes over time when voltage is applied. Specifically, when a bias is applied to the gate electrode of the drive transistor, electrons are injected to a gate insulating film when a positive bias is applied, and holes are injected when a negative bias is applied, and thus a positive or negative threshold voltage shift occurs.

Figure 4:
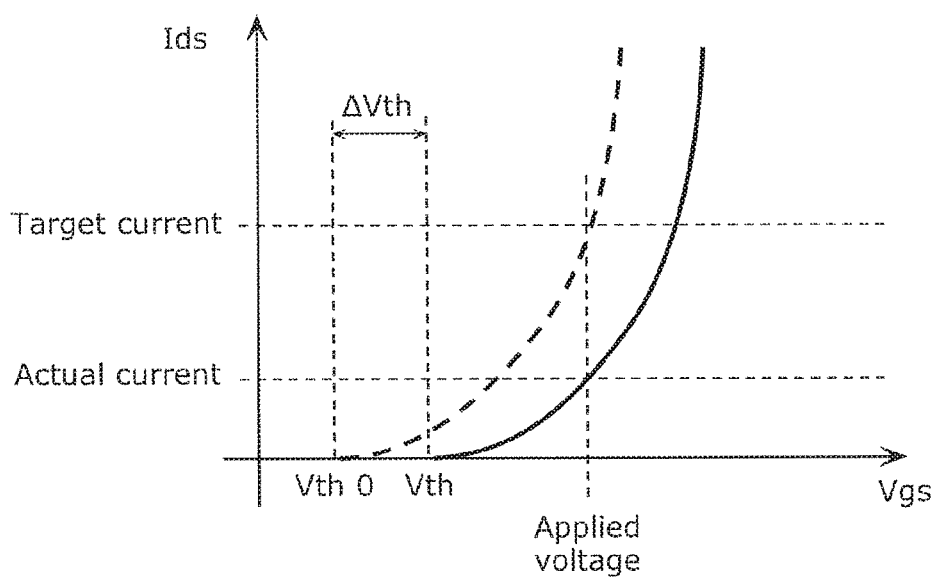
FIG. 4 is a graph illustrating an outline of the relationship between a gate-source voltage $V_{gs}$ applied across the gate and source of a drive transistor and a current $I_{ds}$ flowing across the drain and source of the drive transistor.

FIG. 4 is a graph illustrating an outline of the relationship (transmission characteristics) between a gate-source voltage $V_{gs}$ (video signal voltage) that is applied across the gate and source of the drive transistor and a current $I_{ds}$ (current supplied to the organic EL) which flows across the drain and source. In FIG. 4, the broken line denotes the transmission property of the drive transistor at the start of usage, and the solid line denotes the transmission characteristics after the threshold voltage changes due to voltage application. As illustrated in FIG. 4, in a TFT, application of voltage across the gate and source causes the threshold voltage to shift from $V_{th0}$ to $V_{th}$. Accordingly, at the start of usage, even when the applied voltage needed to obtain a target current is applied after the threshold voltage shift, the target current is not obtained, and current of the desired magnitude cannot be supplied to the organic EL.

In view of this, in the organic EL display device according to the underlying knowledge forming the basis of the present disclosure, in order to suppress the effect of the change in luminance of the organic EL due to the threshold voltage shift, the gate-source voltage $V_{gs}$ is offset by the th hold voltage shift amount $\Delta V_{th}$.

Here, the offset amount of the gate-source voltage $V_{gs}$ is determined based on the accumulated stress amount on the drive transistor calculated from the history of the gate-source voltage $V_{gs}$.

For example, the relationship between the application time and the threshold voltage shift amount $\Delta V_{th}$ when predetermined stress (gate-source voltage) is applied to the drive transistor is calculated by experimentation, etc., to create a model for predicting the threshold voltage shift amount $\Delta V_{th}$ corresponding to the accumulated stress amount.

Figure 5:
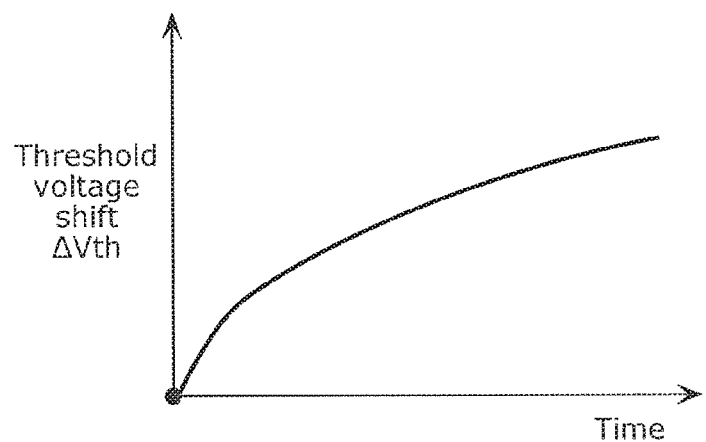
FIG. 5 is a graph illustrating a model relationship between stress application time and a threshold voltage shift amount $\Delta V_{th}$.

FIG. 5 is a graph illustrating a model relationship between the stress application time and the threshold voltage shift amount $\Delta V_{th}$. Using a model such as that illustrated in FIG. 5, the offset amount of the threshold voltage shift amount $\Delta V_{th}$ is determined so as to compensate for the threshold voltage shift amount $\Delta V_{th}$ corresponding to the accumulated stress amount.

In an actual TFT, however, the threshold voltage shift partially recovers when voltage is not applied. Specifically, when the bias of the gate of the TFT becomes 0 V, the electrons or holes injected into the gate insulating film escape from the gate insulating film due to the thermal energy of environmental temperature, and thus threshold voltage shift recovery occurs. As such, an error arises between the offset amount determined based on the accumulated stress amount and the threshold voltage shift amount $\Delta V_{th}$, and this error accumulates with the passage of time.

Here, the result of an experiment performed by the inventor of the present application with respect to the above-described threshold voltage shift recovery will be described. In this experiment, applying a 20-V gate-source voltage to the TFT for 30 minutes as stress, and leaving the gate-source voltage of the TFT at 0 V for 3 hours are repeated. In the applying, a gate potential $V_g$ was set to 20 V, and a source potential $V_s$ and a drain potential $V_d$ were set to 0 V; and in the leaving, the gate potential $V_g$, the source potential $V_s$, and the drain potential $V_d$ were set to 0 V. The experiment used a TFT including a gate insulating film configured of a 220-nm-thick silicon nitride film and a 50-nm-thick silicon oxide film, and a semiconductor layer configured of a 90-nm-thick oxide semiconductor. Furthermore, the environmental temperature in the experiment was maintained at 45 degrees C.

The result of the above-described experiment will be described using FIG. 6 to FIG. 11.

Figure 6:
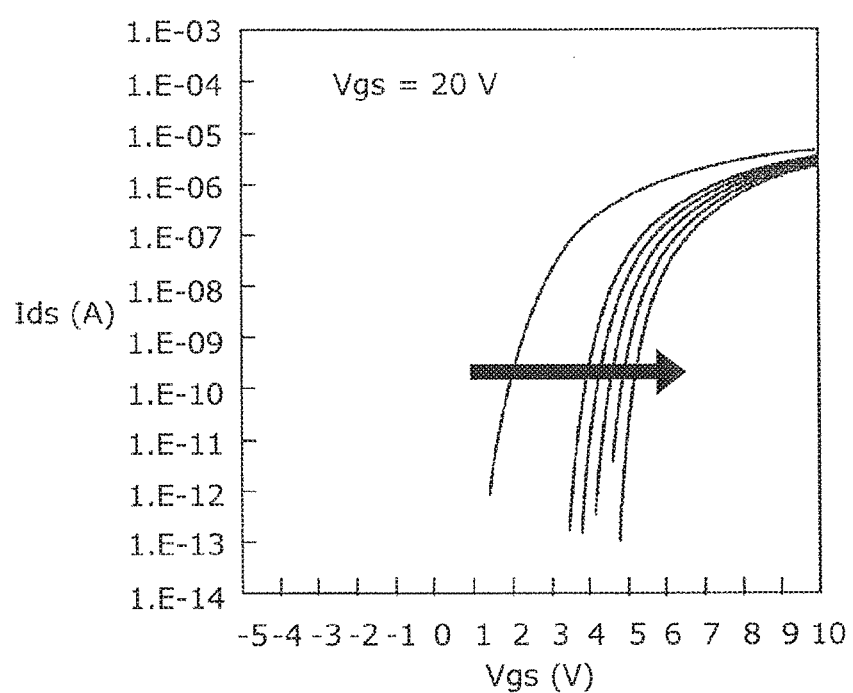
FIG. 6 is a graph illustrating the change over time of transmission characteristics of a TFT in a first iteration of the applying.

FIG. 6 is a graph illustrating the change over time of the transmission characteristics of a TFT in the first iteration of the applying. The black arrow in the figure denotes the passage of time (same in FIG. 7 to FIG. 10 below). It can be verified from FIG. 6 that the curved line denoting the transmission characteristics shifts to the right with the passage of time, that is, the threshold voltage of the TFT shifts in the positive direction.

Figure 7:
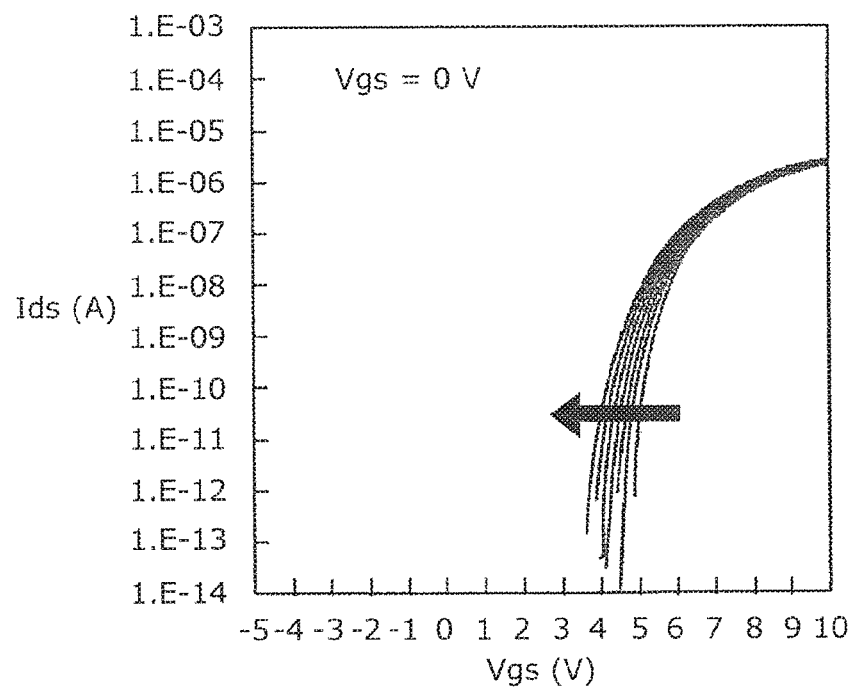
FIG. 7 is a graph illustrating the change over time of transmission characteristics of a TFT in a first iteration of the leaving.

FIG. 7 is a graph illustrating the change over time of the transmission characteristics of the TFT in the first iteration of the leaving after the first iteration of the applying. It can be verified from FIG. 7 that the curved line denoting the transmission characteristics shifts to the left with the passage of time, that is, the threshold voltage of the TFT shifts in the negative direction.

Figure 8:
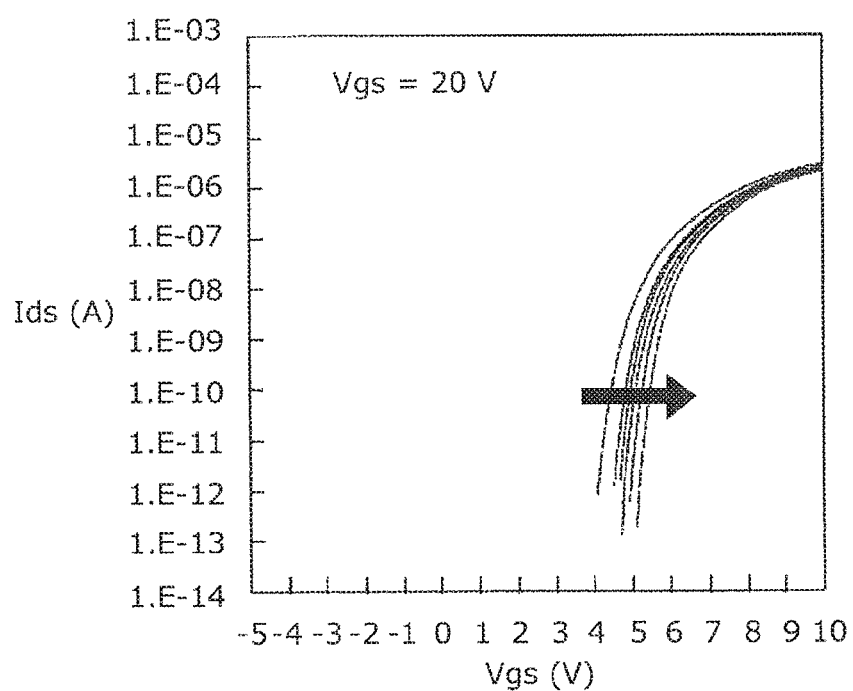
FIG. 8 is a graph illustrating the change over time of transmission characteristics of a TFT in a second iteration of the applying.
Figure 9:
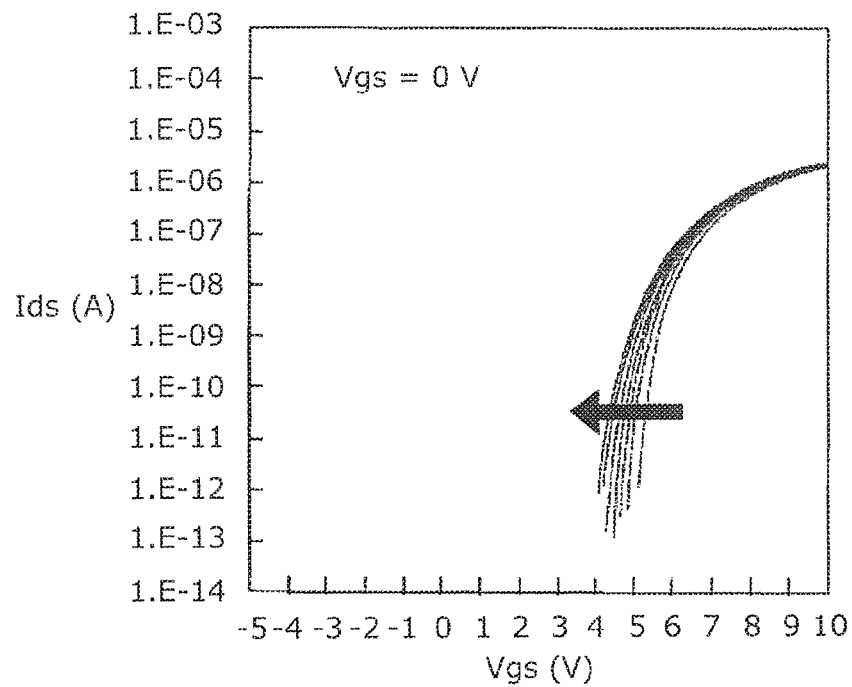
FIG. 9 is a graph illustrating the change over time of transmission characteristics of a TFT in a second iteration of the leaving.
Figure 10:
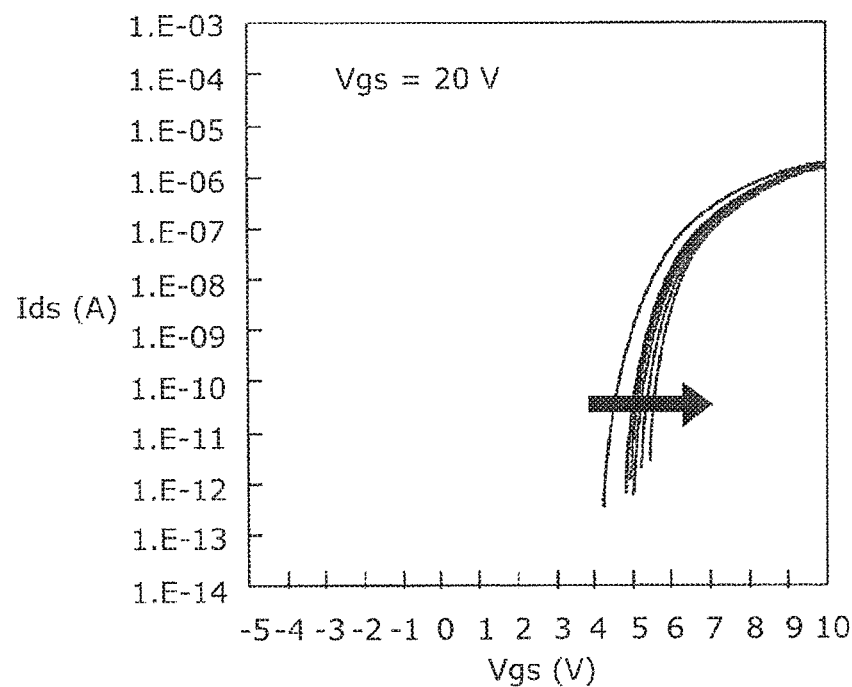
FIG. 10 is a graph illustrating the change over time of transmission characteristics of a TFT in a third iteration of the applying.

FIG. 8, FIG. 9, and FIG. 10 are graphs illustrating the change over time of the transmission characteristics of the TFT in the second iteration of the applying, the second iteration of the leaving, and the third iteration of the applying, respectively. It can be verified from FIG. 8, FIG. 9, and FIG. 10 that, like in FIG. 6 and FIG. 7, the threshold voltage of the TFT shifts in the positive direction in the applying, and the threshold voltage shifts in the negative direction in the leaving, that is, the threshold voltage recovers.

Figure 11:
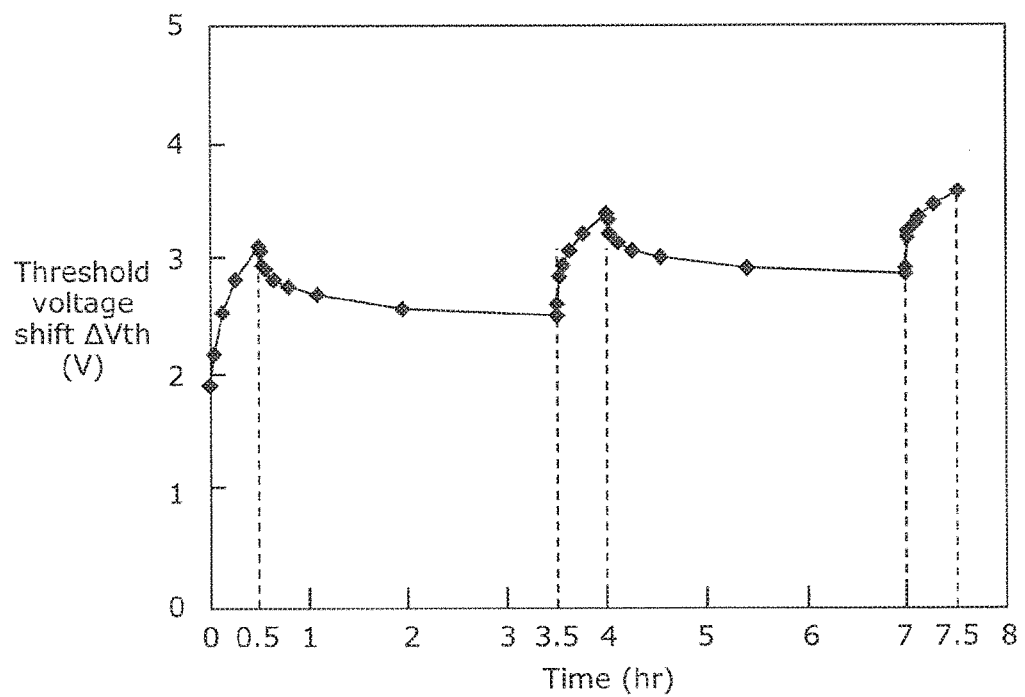
FIG. 11 is graph illustrating the change over time of a threshold voltage shift when the applying and the leaving are repeated.

FIG. 11 is a graph illustrating the change over time of threshold voltage shift. In the horizontal axis, the period from 0 to 0.5 corresponds to the first iteration of the applying, and the period from 0.5 to 3.5 corresponds to the first iteration of the leaving. Furthermore, the period from 3.5 to 4 corresponds to the second iteration of the applying, and the period from 4 to 7 corresponds to the second iteration of the leaving. The period from 7 to 7.5 corresponds to the third iteration of the applying. As illustrated in FIG. 11, it can be verified that the threshold voltage shifts in the positive direction in the applying and the threshold voltage partially recovers and shifts in the negative direction in the leaving.

Figure 12:
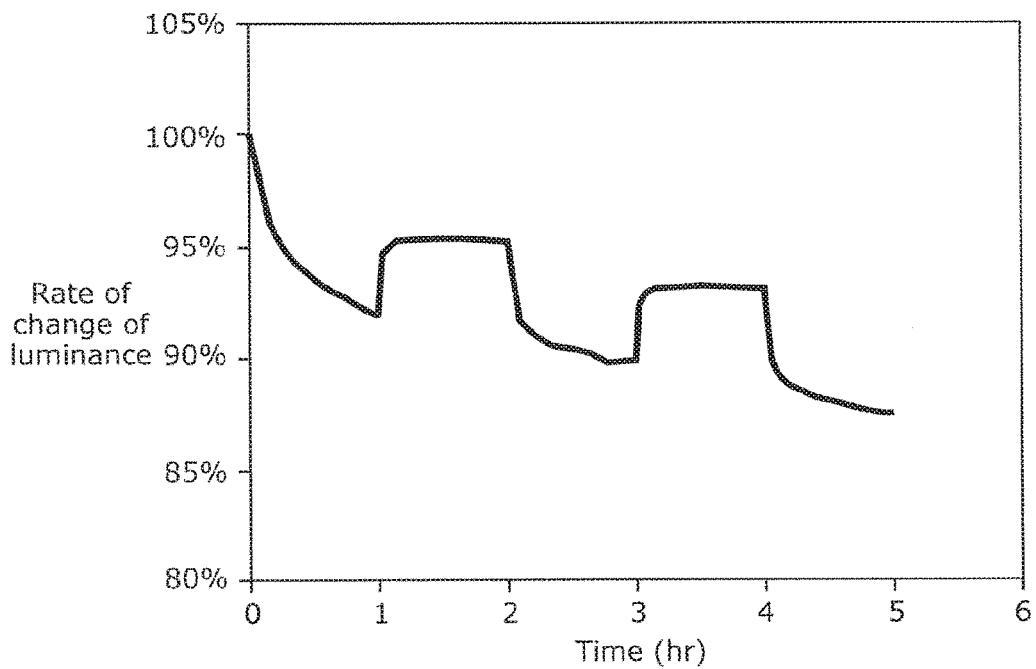
FIG. 12 is a graph illustrating the change over time of luminance.

Furthermore, FIG. 12 is a graph illustrating the change over time of luminance of an organic EL display including a TFT with the above-described characteristics. This is a verification of the luminance transition when two repetitions of light-emitting and black display are performed every 60 minutes in a luminance measurement area. As illustrated in FIG. 12, it can be seen that although luminance gradually deteriorates following continuous light-emitting, when black display (non-light-emitting) is subsequently performed and luminance measurement is performed on each occasion, recovery of luminance can be observed. It should be noted that the rate of change of luminance in the black display periods in FIG. 12 is based on a plurality of measurement results obtained when the luminance measurement at the point in time when black display is switched to the light-emitting state, is performed at different points in time and at different areas.

Figure 13:
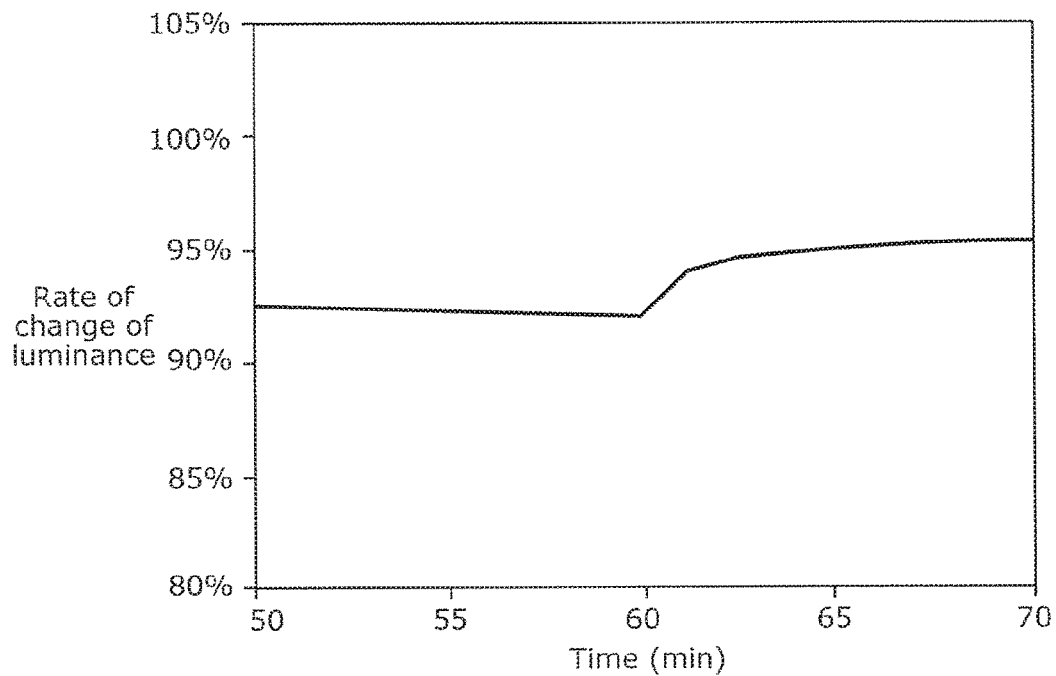
FIG. 13 is a graph illustrating a state of luminance recovery.

FIG. 13 is an enlarged view of the luminance transition from 50 minutes after the start until 70 minutes after in FIG. 12. As illustrated in FIG. 13, it can be seen that luminance recovery saturates in approximately 5 minutes.

Specifically, it can be seen from the foregoing that when continuous light-emitting is performed, then a non-light-emitting period is provided, and light-emitting is performed again, the luminance recovery state in the non-light-emitting period is different depending on the timing of the re-emitting of light, and thus the luminance at the start of re-emitting of light differs. Then, as result, for example, although there are cases where measurement of lifespan characteristics, specifically, measuring the change over time of luminance is incorporated in the process of manufacturing the display device, in this case, the luminance data is affected by the timing at which luminance is measured, and thus there are cases where this leads to the problem that the reliability of the obtained luminance data deteriorates.

For example, in the verification testing of lifespan characteristics of an organic EL display, a state where the entire screen of the display is caused to emit light is continued for a certain period or a state where the screen is partitioned into small areas and a plurality of the small areas are caused to emit light is continued for a certain period, and, subsequently, the luminance at a certain point in time is verified.

Here, luminance verification in the case where a plurality of small areas are caused to emit light is performed as follows. Specifically, out of the plurality of small areas which have been caused to emit light simultaneously, only one small area for which luminance is to be measured is caused to emit light; and the rest of the small areas which have been caused to emit light simultaneously are placed in a state of black display (non-light-emitting), that is, the bias at the gate of the TFT is set to 0 V.

Therefore, when verifying the luminance for all of the plurality of small areas, the black display leaving periods become different depending on the order in which the small areas are verified, and thus the luminance recovery state is different for each small area. As a result, there are cases where this leads to the problem that the reliability of the obtained luminance data deteriorates.

Furthermore, even when the entire screen of the display is caused to emit light, when verifying luminance, the black display leaving periods become different depending on the timing of the luminance verification, and thus there are cases where the same problem occurs.

The cause of these problems, as described above, is that the threshold voltage of the drive transistor shifts due to voltage stress such as gate-source voltage when the drive transistor is powered up, and, as a result, the amount of current supplied to the organic EL fluctuates. However, the shift amount is in the positive direction or the negative direction depending on the gate-source voltage. Based on this, the luminance value differs depending on the timing of the measurement of the luminance of the display device and the history up to the luminance measurement.

[3. Method for Manufacturing the Display Device According to the Present Disclosure]

Figure 14:
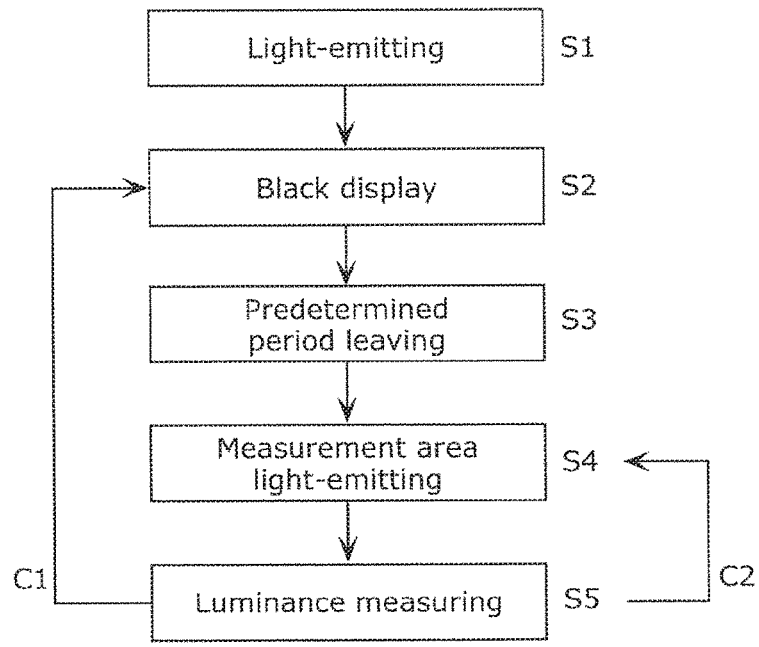
FIG. 14 is a diagram illustrating a flowchart indicating a method of manufacturing a display device including a drive transistor, according to an embodiment.

In view of this, in the method of manufacturing a display device including a drive transistor according to an embodiment of the present disclosure, the luminance measurement process such as that illustrated in the flowchart in FIG. 14 is performed on the entirety or a sampling.

Specifically, if, immediately before luminance measurement, the luminance measurement area is in a light-emitting state even for a moment (light-emitting: S1), the luminance measurement area is temporarily placed in a non-light-emitting state (black display: S2).

Then, after leaving the luminance measurement area in a displaying state where the smallest load is applied to the drive transistor (i.e., black display) for greater than or equal to a predetermined period for causing the drive transistor current recovery behavior (threshold voltage shift recovery behavior) to saturate (predetermined period leaving: S3), the luminance measurement area is placed in the light-emitting state (measurement area light-emitting: S4), after which luminance measurement is performed immediately (luminance measuring: S5). Luminance measurement is performed immediately in order to minimize the effects of light-emitting in the measurement area light-emitting in S4.

In addition, in the case where luminance measurement is to be performed continuously, when the light-emitting in S1 means placing the entire screen of the organic EL display in the light-emitting state or when the same area is to be measured regardless of the state of the light-emitting in S1 (case C1), the process returns to the black display in S2 after the luminance measuring in S5, and luminance measurement is performed according to the steps from S2 to S5. Furthermore, when the placing in the light-emitting state in S1 refers to a causing a plurality of small areas to emit light simultaneously, and the measurement area is to be changed (case C2), the process returns to the placing of the measurement area in the light-emitting state in S4 after the measuring of luminance in S5, and the luminance measurement in the measuring of luminance in S5 is performed immediately.

Here, since individual values are obtained depending on the structure and material of the panel, it is sufficient to set the predetermined period in the predetermined period leaving in S3 after verifying (measuring) in advance as necessary.

For example, in the case of the characteristics illustrated in FIG. 12, since it is understood that the luminance recovery in the black display period saturates in 5 minutes, it is sufficient that the predetermined period leaving (S3) be determined to be leaving for 5 minutes or more.

[4. Advantageous Effects, Etc.]

As described above, the effects of the light-emitting state up to immediately before luminance is measured and the timing at which the luminance is measured during luminance measurement can be avoided, and thus the reliability of luminance measurement can be improved. Specifically, since introducing the predetermined period leaving (S3) enables the current recovery behavior (that is, the threshold voltage shift recovery behavior) of the drive transistor to be placed in a saturated state, and then the luminance measurement is performed, it is possible to perform luminance measurement with uniformity, and thus it is possible to manufacture a display device having high reliability.

In this manner, a method for manufacturing a display device according to an aspect of the present disclosure is a method for manufacturing a display device which includes a light-emitting pixel and a drive transistor that drives the light-emitting pixel using current, including: (a) placing the display device in a light-emitting state; (b) placing the display device in a non-light-emitting state after (a); (c) leaving the display device in the non-light-emitting state for a predetermined period; (d) placing the display device in the light-emitting state again after (c); and (e) measuring luminance of the display device at a start of (d).

According to this configuration, since the current recovery behavior (that is, the threshold voltage shift recovery behavior) of the drive transistor can be placed in a saturated state, and then the luminance measurement is performed, reliability of luminance measurement can be improved.

Here, the predetermined period may be greater than or equal to a period from when the display device changes from the light-emitting state to the non-light-emitting state to when a recovery behavior of a shift in a threshold voltage of the drive transistor saturates.

Here, the predetermined period may be greater than or equal to five minutes.

Here, the method for manufacturing a display device may further include (f) measuring a period from when the display device changes from the light-emitting state to the non-light-emitting state to when a recovery behavior of a shift in a threshold voltage of the drive transistor saturates, and determining, as the predetermined period, a period that is longer than the period that has been measured.

Here, in the method for manufacturing a display device, the respective steps may be executed in units of plural small areas each including one or more light-emitting pixels.

Although a method for manufacturing a display device has been described based on an embodiment thus far, the present disclosure is not limited to this embodiment. Forms obtained by various modifications to this embodiment that can be conceived by a person of skill in the art as well as forms realized by combining structural components in different embodiments, which are within the scope of the essence of the present disclosure may be included in one or more aspects.

Therefore, the structural elements described in the accompanying drawings and detailed description include, not only structural elements essential to solving the problem, but also structural elements that are not essential to solving the problem but are included in order to exemplify the aforementioned technique. As such, description of these non-essential structural components in the accompanying drawings and the detailed description should not be taken to mean that these non-essential structural elements are essential.

Furthermore, since the foregoing embodiment is for exemplifying the technique according to the present disclosure, various changes, substitutions, additions, omissions, and so on, can be carried out within the scope of the Claims or its equivalents.

INDUSTRIAL APPLICABILITY

As described above, the present disclosure is useful in manufacturing a display device that includes a drive transistor, such as an organic EL display device.

The invention claimed is:

1. A method for manufacturing a display device which includes a light-emitting pixel and a drive transistor that drives the light-emitting pixel using current, the method comprising:
    (a) placing, via the drive transistor, the display device in a light-emitting state;
    (b) placing, via the drive transistor, the display device in a non-light-emitting state after (a);
    (c) leaving, via the drive transistor, the display device in the non-light-emitting state for a predetermined period;
    (d) placing, via the drive transistor, the display device in the light-emitting state again after (c); and
    (e) measuring luminance of the display device at a start of (d).

2. The method for manufacturing a display device according to claim 1,
    wherein the predetermined period is greater than or equal to a period from when the display device changes from the light-emitting state to the non-light-emitting state to when a recovery behavior of a shift in a threshold voltage of the drive transistor saturates.

3. The method for manufacturing a display device according to claim 2,
    wherein the predetermined period is greater than or equal to five minutes.

4. The method for manufacturing a display device according to claim 1, further comprising
    (f) measuring a period from when the display device changes from the light-emitting state to the non-light-emitting state to when a recovery behavior of a shift in a threshold voltage of the drive transistor saturates, and determining, as the predetermined period, a period that is longer than the period that has been measured.

* * * * *